(12) United States Patent
Baldwin et al.

(10) Patent No.: US 8,771,926 B2
(45) Date of Patent: Jul. 8, 2014

(54) SLIP FILM FOR RELIEF IMAGE PRINTING ELEMENT

(76) Inventors: Kyle P. Baldwin, Acworth, GA (US); Miguel A. Barboza, Fairburn, GA (US); Laurie A. Bryant, Douglasville, GA (US); Jessica A. Elwell, Kennesaw, GA (US)

( * ) Notice: Subject to any disclaimer, the term of this patent is extended or adjusted under 35 U.S.C. 154(b) by 59 days.

(21) Appl. No.: 13/169,296

(22) Filed: Jun. 27, 2011

(65) Prior Publication Data
US 2012/0328989 A1 Dec. 27, 2012

(51) Int. Cl.
*G03F 7/00* (2006.01)
*G03F 7/26* (2006.01)
*B41N 1/00* (2006.01)
*B41M 5/00* (2006.01)
*C09D 125/06* (2006.01)
*C08F 126/10* (2006.01)
*G03F 7/09* (2006.01)
*C08L 25/06* (2006.01)

(52) U.S. Cl.
CPC .............. *G03F 7/092* (2013.01); *C09D 125/06* (2013.01); *C08F 126/10* (2013.01); *C08L 25/06* (2013.01)
USPC ..... 430/306; 101/453; 101/463.1; 430/270.1; 430/271.1

(58) Field of Classification Search
USPC ......................... 430/302, 306; 101/453, 463.1
See application file for complete search history.

(56) References Cited

U.S. PATENT DOCUMENTS

| | | | |
|---|---|---|---|
| 3,265,765 A | 8/1966 | Holden et al. | |
| 3,867,153 A | 2/1975 | MacLachlan | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A | 11/1986 | Min | |
| 5,039,592 A * | 8/1991 | Umeda .................. | 430/271.1 |
| 5,135,827 A | 8/1992 | Bohm et al. | |
| 5,204,227 A | 4/1993 | Larimer et al. | |
| 5,223,375 A | 6/1993 | Berrier et al. | |
| 5,262,275 A | 11/1993 | Fan | |
| 5,773,126 A | 6/1998 | Noritake et al. | |
| 5,830,620 A * | 11/1998 | Harada et al. ............. | 430/272.1 |
| 5,863,704 A * | 1/1999 | Sakurai et al. ............ | 430/271.1 |
| 6,367,381 B1 * | 4/2002 | Kanga ....................... | 101/395 |
| 6,376,067 B1 | 4/2002 | Heberger et al. | |
| 6,645,615 B2 | 11/2003 | Heberger et al. | |
| 6,849,312 B1 * | 2/2005 | Williams ................... | 428/32.81 |
| 2003/0113517 A1 * | 6/2003 | Imamura et al. ............. | 428/195 |
| 2004/0053037 A1 | 3/2004 | Koch et al. | |
| 2006/0063109 A1 * | 3/2006 | Choi et al. ................. | 430/300 |
| 2006/0073417 A1 * | 4/2006 | Hermesdorf .................. | 430/302 |
| 2011/0081614 A1 | 4/2011 | Recchia | |
| 2011/0090299 A1 * | 4/2011 | Asai et al. .................... | 347/238 |

FOREIGN PATENT DOCUMENTS

| | | |
|---|---|---|
| EP | 0 456 336 | 11/1991 |
| EP | 0 640 878 | 3/1995 |
| GB | 1 366 769 | 9/1974 |

* cited by examiner

*Primary Examiner* — Chanceity Robinson
(74) *Attorney, Agent, or Firm* — Carmody Torrance Sandak & Hennessey LLP

(57) ABSTRACT

A method of preparing a photosensitive printing blank, the method comprising the steps of: a) coating a slip film onto a coversheet and drying the slip film; and depositing at least one layer of photosensitive material on top of the slip film coated coversheet and laminating a substrate layer to the exposed surface of the photosensitive material. The slip film comprises: i) a polymer selected from the group consisting of polystyrene and polyvinylpyrrolidone; ii) optionally, an additive. The slip film at least substantially eliminates the formation of hot spots during an analog plate making process.

17 Claims, No Drawings

SLIP FILM FOR RELIEF IMAGE PRINTING ELEMENT

FIELD OF THE INVENTION

The present invention relates generally to an improved slip film for a photosensitive printing element.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally the most widely used support layer is a flexible film of polyethylene terephthalate that is typically about 5 mils or so thick. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of LTV light in the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahari, U.S. Pat. No. 4,264,705 to Allen, U.S. Pat. Nos. 4,323,630; 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gmetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used. When only a single photocurable layer is present, it may be anywhere from about 25-275 mils thick.

In some plates, there is a second photocurable layer (referred to as an "overcoat" or "printing" layer) atop this first, base layer of photocurable material. This second layer usually has a similar composition to the first layer, but is generally much thinner, being on the order of less than 10 mils thick.

The photocurable materials generally cross-link (cure) and harden through radical polymerization in at least some actinic wavelength region. As used herein, actinic radiation is radiation capable of affecting a chemical change in an exposed moiety thereby causing crosslinking, polymerization, or curing. Actinic radiation includes, for example, amplified (e.g., laser) and non-amplified light, particularly in the 1N and violet wavelength regions. One commonly used source of actinic radiation is a mercury arc lamp, although other sources are generally known to those skilled in the art.

The slip film is a thin layer (typically about 0.1 to 1.0 mil in thickness), which protects the photopolymer from dust and increases its ease of handling. In a conventional ("analog") plate making process, the slip film is transparent to UV light. In normal use, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief; among other factors, affect the quality of the printed image. After the relief image is developed, the relief image printing element may be mounted on a press and printing commenced.

Exposure of the printing plate is usually carried out by application of a vacuum to ensure good contact between the negative and the plate. Any air gap will cause deterioration of the image. Similarly, any foreign material, such as dirt and dust between the negative and the plate results in loss of image quality.

Hot spots are a phenomenon that occurs with analog plates. Upon exposure, an air bubble can become entrapped between the negative and the slip film (on top of the plate). This air bubble causes a distortion of the light going to the plate and, in addition, can cause the negative to rise up slightly resulting in off-contact. The result is what is known as a "hot spot" and it manifests itself in the form of a reverse closing in or a feature disappearing. The hot spot essentially results in a loss of resolution in a specific region.

Attempts to get around hot spots have focused on reducing the exposure time or even by reducing the exposure time in a specific region of the plate.

The hot spots occur for a variety of reasons, including the following:
1) Imaging latitude;
2) Thickness of the negative;
3) Temperature of exposure, or ability of exposing unit to dissipate heat; and
4) Type of slip film (as discovered by the inventors here).

Firstly, the imaging latitude of a given plate makes the plate more or less vulnerable to hot spot formation. The more energy that a given plate can accept and still hold a reverse, the less likely a hot spot will occur with that plate, or the less likely an occurring hot spot will affect that plate.

Second, the thickness of the negative can have a detrimental effect on the occurrence of hot spots. In general, the thicker the negative, the less likely the occurrence of hot spots. In addition, certain markets, including South America, prefer a low-cost, thin negative. Thus, hot spots can be more common in these markets.

Another common aspect of the low cost market is the use of exposure units that do not have an adequate cooling system in place, which also results in hot spots.

Finally, the type of slip film employed can also result in hot spots, as discovered by the inventors here. The inventors have surprisingly found that polyamide, which is commonly used as a slip film in flexographic printing elements produces hot spots. Based thereon, the inventors of the present invention have identified several other types of polymer systems and additives that may be used to formulate slip films and that are capable of substantially preventing the formation of hot spots.

SUMMARY OF THE INVENTION

It is an object of the present invention to prevent the formation of hot spots during an analog plate making process.

It is another object of the present invention to provide an improved slip film formulation that is capable of preventing the formation of hot spots during the analog plate making process.

To that end, in one embodiment, the present invention relates generally to a method of preparing a photosensitive printing blank, the method comprising the steps of:
 a) applying a slip film onto a printing element, which printing element comprises at least one layer of photopolymerizable material and a substrate layer such that the at least one layer of photopolymerizable material is between the substrate layer and the slip film; and
 wherein the slip film comprises:
  i) a polymer selected from the group consisting of polystyrene and polyvinylpyrrolidone; and
  ii) optionally, an additive;
 wherein the slip film is preferably free of polyamide.

In another embodiment, the present invention relates generally to a slip film for use in a flexographic relief image printing element, wherein the printing element comprises a slip film layer, at least one photopolymerizable layer and a substrate layer such that the at least one photopolymerizable layer is between the slip film layer and the substrate layer, the slip film layer comprising:
 a) a polymer selected from the group consisting of polystyrene and polyvinylpyrrolidone; and
 b) optionally, an additive;
 wherein the slip film is preferably free of polyamide.

DETAILED DESCRIPTION OF THE PREFERRED EMBODIMENTS

The inventors of the present invention have found that the use of the slip film described herein at least substantially prevents the formation of hot spots during imaging of flexographic printing elements.

To that end, in one embodiment, the present invention relates generally to a method of preparing a photosensitive printing blank, the method comprising the steps of:
 a) applying a slip film onto a printing element, which printing element comprises at least one layer of photopolymerizable material and a substrate layer such that the at least one layer of photopolymerizable material is between the substrate layer and the slip film; and
 wherein the slip film comprises:
  i) a polymer selected from the group consisting of polystyrene and polyvinylpyrrolidone; and
  ii) optionally, an additive.
 wherein the slip film is preferably free of polyamide.

The wet coating of the slip film is preferably made up of the specified polymer, solvent, solvent dye and additional additive. The concentration of the polymer in the slip film wet coating is typically in the range of about 6 to about 30 percent by weight, preferably between about 6 to about 11 percent by weight.

The solvent is chosen so as to be compatible with the specific polymer and typically may be selected from the group consisting of toluene, ketones such as acetone, alcohols especially primary alcohols and combinations of one or more of the foregoing. Methylethyl ketone and 2-propanol are also suitable solvents. The concentration of the solvent in the slip film wet coating is typically in the range of about 65 to about 95 percent by weight, preferably between about 85 to about 95 percent by weight.

The additional additive is added to the slip film composition to prevent cracking and other associated problems with the slip film composition at the thickness provided. This additional additive may be selected from ethylene and propylene glycols, mineral oils, styrene-butadiene oils, butadiene oils and copolymers of acetonitriles. In one embodiment, the additional additive is an acrylonitrile copolymer. The concentration of the additional additive in the slip film wet coating is typically in the range of about 0.1 to about 5.0 percent by weight, preferably between about 0.5 to about 3.5 percent by weight.

The slip film also preferably comprises a solvent dye to create a contrast between the imaged and non-imaged areas. Examples of such solvent dyes include Waxoline red dye (1-(napthalen-1-ylhydrazinylidene naphthalene-2-one) and similar solvent dyes. The concentration of the solvent dye in the slip film wet coating is typically in the range of about 0.01 to about 0.10 percent by weight, preferably between about 0.05 to about 0.06 percent by weight.

During manufacturing the slip film is first coated onto a removable coversheet which is preferably a polyethylene terephthalate coversheet and dried. At least one layer of photosensitive material is then deposited onto the slip film coated coversheet, preferably by extrusion, and the substrate layer is laminated to the exposed face of the photosensitive material.

In a preferred embodiment, the wet coated slip film comprises polystyrene as the polymer and toluene as the solvent. In addition, the additive is present in the slip film and comprises a co-polymer of acetonitrile. In another preferred embodiment, the wet coated slip film comprises polyvinylpyrrolidone as the polymer and propanol and acetone as the solvent. In addition, the additive is present in the slip film and comprises a co-polymer of acetonitrile.

The slip film typically has a thickness in the range of about 1.0 to 15.0 grams per square meter (gsm) (which is approximately equivalent to about one micron), more preferably between about 2.0 and 5.0 g/sm and most preferably about 2.5 g/sm.

Finally, the method may further comprise the steps of:
a) removing the coversheet from the slip film;
b) placing a negative on top of the slip film;
c) exposing the at least one layer of photosensitive material to actinic radiation through the negative and the slip film to selectively crosslink and cure the at least one layer of photosensitive material and produce a relief image printing element;

wherein the presence of the slip film at least substantially eliminates the formation of hot spots in the relief image printing element.

In addition, the method may further comprise the step of developing the exposed relief image printing element to remove uncrosslinked photosensitive material and reveal the relief image.

As discussed above, the use of polyamides in the slip film composition can lead to the formation of hot spots. Therefore, it is preferable that the slip film composition does not contain any polyamide.

Example 1

A slip film was prepared comprising

| Toluene | 69.95% by weight |
|---|---|
| p-styrene | 30.05% by weight |
| Waxoline red dye | 0.050% by weight |

The slip film composition was then coated onto a polyethylene terephthalate cover sheet and dried. A photopolymer composition was then extruded onto the slip film coated coversheet and a backing sheet is laminated thereon.

The prepared printing element, comprising the backing sheet, photopolymer layer, slip film and coversheet was then processed in a normal fashion.

The printer peels off the cover sheet and places a negative on top of the slip film layer. The plate and negative are then subjected to flood-exposure by UV light through the negative. The areas exposed to the light cure, or harden, and the unexposed areas are removed (developed) to create the relief image on the printing plate.

No hot spots were observed.

Example 2

A slip film was prepared comprising:

| Toluene | 88.40% by weight |
|---|---|
| p-styrene | 11.00% by weight |
| Nipol acrylonitrile copolymer | 0.550% by weight |
| Waxoline red dye | 0.050% by weight |

The slip film composition was then coated onto a polyethylene terephthalate cover sheet and dried. A photopolymer was then extruded onto the slip film coated coversheet and a backing sheet is laminated thereon.

The prepared printing element, comprising the backing sheet, photopolymer layer, slip film and coversheet was then processed in a normal fashion.

The printer peels off the cover sheet and places a negative on top of the slip film layer. The plate and negative are then subjected to flood-exposure by UV light through the negative. The areas exposed to the light cure, or harden, and the unexposed areas are removed (developed) to create the relief image on the printing plate.

No hot spots were observed.

Example 3

A slip film was prepared comprising:

| Propanol | 45.34% by weight |
|---|---|
| Acetone | 45.00% by weight |
| Polyvinylpyrrolidone | 9.600% by weight |
| Waxoline red dye | 0.060% by weight |

The slip film composition was then coated onto a polyethylene terephthalate cover sheet and dried. A photopolymer was then extruded onto the slip film coated coversheet and a backing sheet is laminated thereon.

The prepared printing element, comprising the backing sheet, photopolymer layer, slip film and coversheet was then processed in a normal fashion.

The printer peels off the cover sheet and places a negative on top of the slip film layer. The plate and negative are then subjected to flood-exposure by UV light through the negative. The areas exposed to the light cure, or harden, and the unexposed areas are removed (developed) to create the relief image on the printing plate.

Again, no hot spots were observed.

Example 4

A slip film was prepared comprising:

| Propanol | 45.00% by weight |
|---|---|
| Acetone | 44.94% by weight |
| Polyvinylpyrrolidone | 6.600% by weight |
| Nipol acrylonitrile copolymer | 3.400% by weight |
| Waxoline red dye | 0.060% by weight |

The slip film composition was then coated onto a polyethylene terephthalate cover sheet and dried. A photopolymer was then extruded onto the slip film coated coversheet and a backing sheet is laminated thereon.

The prepared printing element, comprising the backing sheet, photopolymer layer, slip film and coversheet was then processed in a normal fashion.

The printer peels off the cover sheet and places a negative on top of the slip film layer. The plate and negative are then subjected to flood-exposure by UV light through the negative. The areas exposed to the light cure, or harden, and the unexposed areas are removed (developed) to create the relief image on the printing plate.

No hot spots were observed.

Thus, it can be seen that the particular slip film composition provides benefits over prior art slip film formulations and substantially eliminates the formation of hot spots during an analog plate making process.

It is also to be understood that the following claims are intended to cover all of the generic and specific features of the invention described herein and all statements of the scope of the invention which as a matter of language might fall therebetween.

What is claimed is:

1. A method of preparing a photosensitive printing blank, the method comprising the steps of:
   a) coating a slip film onto a coversheet and drying the slip film; and
   b) depositing at least one layer of photosensitive material on top of the dried slip film coated coversheet and laminating a substrate layer to an exposed face of the at least one layer of photosensitive material;
wherein the slip film comprises:
i) a polymer selected from the group consisting of polystyrene and polyvinylpyrrolidone; and
ii) 0.1 to 5.0 percent by weight of an additive, where the additive is selected from the group consisting of ethylene glycol, propylene glycol, mineral oils, styrene-butadiene oils, butadiene oils, and copolymers of acetonitriles;
wherein prior to drying, the slip film also comprises a solvent selected from the group consisting of toluene, acetone, primary alcohols, methylethyl ketone, 2-propanol, and combinations of one or more of the foregoing.

2. The method according to claim 1, wherein the concentration of the polymer in the slip film, prior to drying, is between about 6 to about 30 percent by weight.

3. The method according to claim 2, wherein the concentration of the polymer in the slip film, prior to drying, is between about 6 to about 11 percent by weight.

4. The method according to claim 1, wherein the concentration of the solvent in the slip film prior to drying is between about 65 to about 95 percent by weight.

5. The method according to claim 4, wherein the concentration of the solvent in the slip film prior to drying is between about 85 to about 95 percent by weight.

6. The method according to claim 1, wherein the concentration of the additive in the slip film, prior to drying, is between about 0.5 to about 3.5 percent by weight.

7. The method according to claim 1, wherein the thickness of the slip film is between about 1.0 and about 15.0 grams per square meter.

8. The method according to claim 7, wherein the thickness of the slip film is between about 2.0 and about 5.0 grams per square meter.

9. The method according to claim 8, wherein the thickness of the slip film is about 2.5 grams per square meter.

10. The method according to claim 1, wherein the slip film does not include a polyamide.

11. The method according to claim 1, wherein the slip film comprises polystyrene as the polymer.

12. The method according to claim 11, wherein the additive is present in the slip film and comprises a co-polymer of acetonitrile.

13. The method according to claim 1, wherein the slip film comprises polyvinylpyrrolidone as the polymer.

14. The method according to claim 13, wherein the additive is present in the slip film and comprises a co-polymer of acetonitrile.

15. The method according to claim 1, further comprising the steps of:
a) removing the coversheet from the slip film and the at least one layer of photosensitive material;
b) placing a negative on top of the slip film;
c) exposing the at least one layer of photosensitive material to actinic radiation through the negative to selectively crosslink and cure the at least one layer of photosensitive material and produce a relief image printing element;
wherein the presence of the slip film at least substantially eliminates the formation of hot spots in the relief image printing element.

16. The method according to claim 1, wherein the solvent comprises toluene.

17. The method according to claim 1, wherein the solvent comprises acetone.

* * * * *